357-15 SR
9/2/86 OR H 000,134

United States Statutory Invention Registration [19]

[11] Reg. Number: H134
[45] Published: Sep. 2, 1986

Skolnik et al.

[54] BURIED JUNCTION ENHANCED SCHOTTKY BARRIER DEVICE

[75] Inventors: Lyn H. Skolnik, Albuquerque, N. Mex.; Sven A. Roosild, Reston, Va.; Freeman D. Shepherd, Jr., Chelmsford, Mass.

[73] Assignee: The United States of America as represented by the Secretary of the Air Force, Washington, D.C.

[21] Appl. No.: 643,139

[22] Filed: Aug. 22, 1984

[51] Int. Cl.[4] ..... H01L 29/48; H01L 21/00
[52] U.S. Cl. ..... 357/15; 357/30; 29/571
[58] Field of Search ..... 357/15, 30, 24

[56] References Cited

U.S. PATENT DOCUMENTS

| | | | |
|---|---|---|---|
| 4,169,231 | 9/1979 | Nash et al. | 307/221 D |
| 4,194,133 | 3/1980 | Shannon | 307/221 D |
| 4,199,691 | 4/1980 | Angle | 307/221 D |
| 4,206,371 | 6/1980 | Weimer | 307/221 D |
| 4,206,470 | 6/1980 | White | 357/30 |
| 4,208,668 | 6/1980 | Krimmel | 357/24 |
| 4,210,922 | 7/1980 | Shannon | 357/24 |
| 4,488,038 | 12/1984 | Harrison | 357/15 X |

*Primary Examiner*—Stephen C. Buczinski
*Assistant Examiner*—Linda J. Wallace
*Attorney, Agent, or Firm*—Donald J. Singer; Richard J. Donahue

[57] ABSTRACT

A Schottky barrier device having a completely submersed Schottky barrier junction to enhance the collection efficiency of photogenerated carriers. A method is also disclosed for manufacturing the device.

10 Claims, 3 Drawing Figures

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

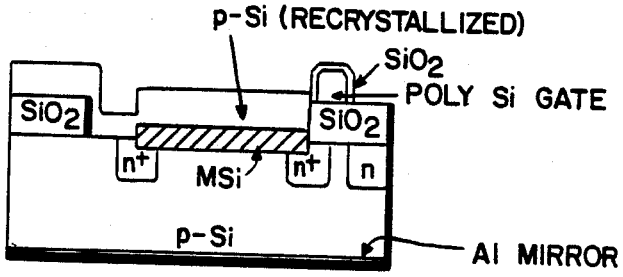

I. DEPOSIT p-POLYSILICON OVER EXPOSED SUBSTRATE AND MSi DIODE.

J. LASER, e-BEAM, OR THERMALLY ANNEAL TO RECRYSTALLIZE SO THAT SINGLE CRYSTAL EPITAXIAL LAYER REGROWS OVER DIODE, FORMING A BACK-TO-BACK p-SI/MSi DIODE STRUCTURE.

K. Al COAT BACK OR FRONT OF STRUCTURE (NOT BOTH) TO FURTHER ENHANCE OPTICAL ABSORPTION.

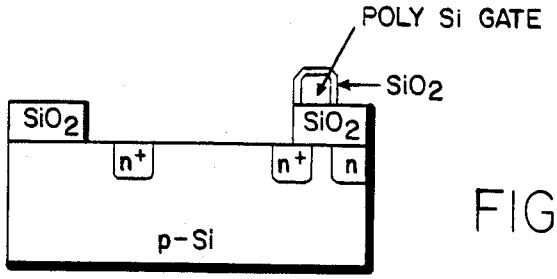

FIG. 1

A. OXIDIZE FOR $n^+$ CONTACTS, GUARD RINGS, n CHANNEL.
B. DIFFUSE $n^+$.
C. REMOVE OXIDES.
D. DEFINE AND DEPOSIT POLY Si GATE AND GATE OXIDE.

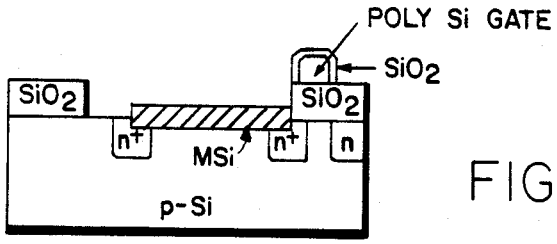

FIG. 2

E. DEFINE WINDOW FOR TRANSITION METAL (Pt OR Ir) DEPOSITION.
F. DEPOSIT METAL (50 – 100A) AND SINTER TO FORM MSi DIODE.
G. REMOVE UNREACTED METAL.
H. ETCH RING AROUND DIODE TO EXPOSE p-Si SUBSTRATE.

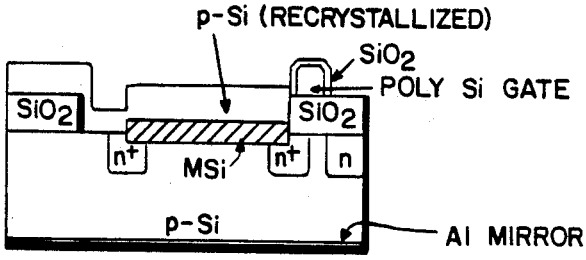

FIG. 3

I. DEPOSIT p-POLYSILICON OVER EXPOSED SUBSTRATE AND MSi DIODE.
J. LASER, e-BEAM, OR THERMALLY ANNEAL TO RECRYSTALLIZE SO THAT SINGLE CRYSTAL EPITAXIAL LAYER REGROWS OVER DIODE, FORMING A BACK-TO-BACK p-Si/MSi DIODE STRUCTURE.
K. Al COAT BACK OR FRONT OF STRUCTURE (NOT BOTH) TO FURTHER ENHANCE OPTICAL ABSORPTION.

BURIED JUNCTION ENHANCED SCHOTTKY BARRIER DEVICE

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to infrared detector devices, and in particular to such a detector utilizing a completely submersed Schottky barrier junction.

When a metal is brought into intimate contact with a semiconductor surface, the resulting metallic semiconductor surface exhibits current rectifying characteristics. Such an interface is commonly referred to as a Schottky barrier device and acts in a similar fashion to a p-n semiconductor junction. Such Schottky barrier devices are well known and have been extensively reported and utilized.

It is also known to build up an array of Schottky barrier devices for infrared sensing, and combining the array with a charge coupled diode readout system for achieving an infrared camara device vidicon system. Such a Schottky diode array is disclosed in U.S. Pat. No. 3,902,066, issued to Sven A. Roosild et al. on Aug. 26, 1975.

Present Schottky infrared charge coupled diode (IRCCD) arrays have low quantum efficiencies (sensitivities) thus limiting their applications for certain thermal imaging scenarios.

It is therefore an object of the present invention to provide an improved Schottky IRCCD device of improved sensitivity and quantum efficiency.

It is a further object of the present invention to provide a method for manufacturing such a device.

SUMMARY OF THE INVENTION

The present invention contemplates a completely submersed Schottky barrier junction in order to enhance collection efficiency of photogenerated carriers. Using a buried active back-to-back thin junction allows collection of carriers generated with momentum vectors in both the forward and reverse directions. Thus, the quantum efficiency and sensitivity of the infrared detector is substantially enhanced. In addition, thicker Schottky metalliations can be used to enhance spectral absorption of incident infrared lights.

BRIEF DESCRIPTION OF THE DRAWING

The foregoing and other advantages, objects and features of this invention will become apparent from the following description when read in conjunction with the accompanying drawing in which:

FIGS. 1, 2 and 3 illustrate various stages in the formation of the buried Schottky barrier IRCCD device of the present invention.

DETAILED DESCRIPTION OF THE PREFERRED EMBODIMENTS

FIG. 1 shows a p-type silicon substrate. The substrate has at this stage been oxidized for n+ contacts, guard rings and an n channel. After the n+ material has been diffused in the substrate the oxides are removed. The channel oxide is then grown. A polysilicon gate (CCD transfer gate) is then defined and polysilicon is deposited for the gate.

Referring now to FIG. 2 of the drawings, a window is now defined for the electrode or transition metal, which is preferrably platinum, but could be other metals such as iridium or palladium for example. The deposited metal, which is the order of 50 to 100 Angstroms thick, is then sintered to form the metal silicide diode. Thereafter, the unreacted metal is removed, a ring is now etched around the diode to expose the p-type silicon substrate and n+ diffusions.

As shown in FIG. 3 of the drawings, a p-type polysilicon layer is now deposited over the exposed substrate. The added layer is then laser or thermally annealed so that a single layer epitaxial layer regrows over the diode, forming a back-to-back p-Si/MSi/p-Si diode structure.

At this point aluminum can be overcoated over either the front or back surface of the structure, but not both, to further enhance optical absorption via optical reflection.

The key feature of this invention, as described above, is the formation of single crystal silicon on both sides of the Schottky sensing electrode via laser or thermal annealing, and the associated advantages of having an embedded electrode for sensing.

Although the invention has been described with reference to a particular embodiment, it will be understood to those skilled in the art that the invention is capable of a variety of alternative embodiments within the spirit and scope of the appended claims. For example, the invention applies to all possible metallic Schottky electrodes and is not restricted to either platinum silicide or iridium silicide electrodes.

What is claimed is:

1. A method for manufacturing a buried junction enhanced Schottky barrier device comprising the steps of:

(a) oxidizing a p-type silicon substrate for contacts, guard rings and an n channel;
(b) diffusing n+ material in defined areas in the front surface of said substrate;
(c) removing oxides from said substrate;
(d) defining and depositing a polysilicon charge transfer gate and gate electrode;
(e) defining an area for the transition metal of said device;
(f) depositing said transition metal and sintering said metal to form a metal-silicon diode;
(g) removing unreacted portions of said metal;
(h) etching a ring around said diode to expose said p-type substrate and n+ diffusions;
(i) depositing p-type silicon over exposed areas of said substrate and said metal silicon diode; and
(j) annealing said device whereby a single layer epitaxial film regrows over said diode to form a back-to-back p-type silicon/metal/p-type silicon diode structure.

2. A method according to claim 1 wherein said transition metal is platinum.

3. A method according to claim 1 wherein said transition metal is iridium.

4. A method according to claim 1 wherein said transition metal is palladium.

5. A method according to claim 1 wherein said transition metal is nickel.

6. A method according to claim 1 and including the additional step of:

overcoating the front surface of said device with aluminium to enhance its optical absorption characteristics.

7. A method according to claim 1 and including the additional step of:

overcoating the back surface of said device with aluminum to enhance its optical absorption characteristics.

8. A buried junction Schottky barrier device comprising:

a semiconductor substrate;

a metal deposited on said substrate to form a first metal-semiconductor interface;

a semiconductor material disposed over the exposed surface of said metal to form a second metal-semiconductor interface; and means for deriving signals from said first and second metal-semiconductor interface.

9. Apparatus as defined in claim 8 wherein said metal is platinum and said semiconductor substrate is p-type silicon.

10. Apparatus as defined in claim 8 and further comprising:

a layer of aluminum disposed over a surface of said substrate to enhance optical absorption of said apparatus.

* * * * *